(12) United States Patent
Van Der Net et al.

(10) Patent No.: US 7,384,149 B2
(45) Date of Patent: *Jun. 10, 2008

(54) LITHOGRAPHIC PROJECTION APPARATUS, GAS PURGING METHOD AND DEVICE MANUFACTURING METHOD AND PURGE GAS SUPPLY SYSTEM

(75) Inventors: Antonius Johannes Van Der Net, Tilburg (NL); Jeffrey J. Spiegelman, San Diego, CA (US); Johannus Josephus Van Bragt, Veldhoven (NL)

(73) Assignees: ASML Netherlands B.V., Veldhoven (NL); Entegris, Inc., Chaska, MN (US)

( * ) Notice: Subject to any disclaimer, the term of this patent is extended or adjusted under 35 U.S.C. 154(b) by 113 days.

This patent is subject to a terminal disclaimer.

(21) Appl. No.: 10/623,180

(22) Filed: Jul. 21, 2003

(65) Prior Publication Data

US 2005/0017198 A1    Jan. 27, 2005

(51) Int. Cl.
*G03B 21/26* (2006.01)
(52) U.S. Cl. .......................... 353/30; 353/53
(58) Field of Classification Search ................ 355/30, 355/52, 53, 67, 72–77; 430/327; 250/492.1
See application file for complete search history.

(56) References Cited

U.S. PATENT DOCUMENTS

| | | | |
|---|---|---|---|
| 4,704,348 A | 11/1987 | Koizumi et al. | |
| 5,499,076 A | 3/1996 | Muraki | |
| 5,892,572 A | 4/1999 | Nishi | |
| 5,910,292 A | 6/1999 | Alvarez, Jr. et al. | |
| 6,059,859 A | 5/2000 | Alvarez, Jr. et al. | |
| 6,089,282 A | 7/2000 | Spiegelman et al. | |
| 6,254,936 B1 | 7/2001 | Gurer et al. | |
| 6,391,090 B1 | 5/2002 | Alvarez, Jr. et al. | |
| 6,394,109 B1 * | 5/2002 | Somekh | 134/39 |

(Continued)

FOREIGN PATENT DOCUMENTS

EP    0 571 997 A1    12/1993

(Continued)

OTHER PUBLICATIONS

International Search Report for PCT/US2007/007901 filed Mar. 28, 2007.

(Continued)

*Primary Examiner*—Rodney E Fuller
(74) *Attorney, Agent, or Firm*—Pillsbury Winthrop Shaw Pittman, LLP (57) ABSTRACT

A lithographic projection apparatus includes a support configured to support a patterning device, the patterning device configure to pattern the projection beam according to a desired patter. The apparatus has a substrate table configure to hold a substrate, a projection system configured to project the patterned beam onto a target portion of the substrate. The apparatus also has a purge gas supply system configured to provide a purge gas near a surface of a component of the lithographic projection apparatus. The purge gas supply system includes a purge gas mixture generator configured to generate a purge gas mixture which includes at least one purging gas and a moisture. The purge gas mixture generator has a moisturizer configured to add the moisture to the purge gas and a purge gas mixture outlet connected to the purge gas mixture generator configured to supply the purge gas mixture near the surface.

20 Claims, 4 Drawing Sheets

U.S. PATENT DOCUMENTS

| | | |
|---|---|---|
| 6,514,313 B1 | 2/2003 | Spiegelman et al. |
| 6,582,496 B1 | 6/2003 | Cheng et al. |
| 6,638,341 B1 | 10/2003 | Spiegelman et al. |
| 6,724,460 B2 * | 4/2004 | Van Schaik et al. .......... 355/30 |
| 6,762,820 B2 | 7/2004 | Udagawa et al. |
| 6,805,731 B2 | 10/2004 | Cheng et al. .................... 96/8 |
| 6,828,569 B2 * | 12/2004 | Van Schaik et al. ..... 250/492.2 |
| 6,829,034 B2 | 12/2004 | Miwa et al. |
| 6,913,654 B2 | 7/2005 | Alvarez, Jr. et al. |
| 6,961,113 B1 | 11/2005 | Hayashi et al. |
| 7,113,254 B2 | 9/2006 | Van Der Net et al. |
| 7,189,291 B2 | 3/2007 | Spiegelman et al. |
| 2002/0057423 A1 | 5/2002 | Nogawa |
| 2003/0035087 A1 | 2/2003 | Murayama |
| 2003/0162305 A1 | 8/2003 | Alvarez, Jr. et al. |
| 2004/0237777 A1 | 12/2004 | Alvarez, Jr., et al. |
| 2004/0238013 A1 | 12/2004 | Spiegelman et al. |
| 2005/0048220 A1 | 3/2005 | Mertens et al. |
| 2005/0051739 A1 | 3/2005 | Van Der Net et al. |
| 2005/0205114 A1 | 9/2005 | Alvarez, Jr., et al. |
| 2006/0118138 A1 | 6/2006 | Spiegelman et al. |
| 2006/0211131 A1 | 9/2006 | Spiegelman et al. |
| 2006/0285091 A1 | 12/2006 | Parekh et al. ................. 355/30 |
| 2007/0030463 A1 | 2/2007 | Parekh et al. ................. 355/30 |
| 2007/0114467 A1 | 5/2007 | Van der Net, et al. |
| 2007/0137676 A1 | 6/2007 | Spiegelman et al. |

FOREIGN PATENT DOCUMENTS

| | | |
|---|---|---|
| EP | 0 678 321 A2 | 10/1995 |
| EP | 1 489 462 A2 | 12/2004 |
| EP | 1 571 698 A1 | 9/2005 |
| EP | 1 628 163 A2 | 2/2006 |
| JP | 2001-358055 | 12/2001 |
| WO | WO 2004/053956 | 6/2004 |
| WO | WO 2005/008339 A2 | 1/2005 |
| WO | WO 2005/010619 A2 | 2/2005 |

OTHER PUBLICATIONS

Singapore Written Opinion issued for Singapore Patent Application No. 200600932-8, dated Jun. 26, 2007.

* cited by examiner

LITHOGRAPHIC PROJECTION APPARATUS, GAS PURGING METHOD AND DEVICE MANUFACTURING METHOD AND PURGE GAS SUPPLY SYSTEM

BACKGROUND OF THE INVENTION

1. Field of the Invention

The present invention relates to a lithographic projection apparatus, a gas purging method, a device manufacturing method and a purge gas supply system.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam of radiation in a given reference direction (the "scanning" direction) while synchronously scanning the substrate table parallel or anti-parallel to this direction. Since, in general, the projection system will have a magnification factor M (generally< 1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

In general, surfaces of components present in a lithographic projection apparatus become contaminated during use, even if most of the apparatus is operated in vacuum. In particular the contamination of optical components in the lithographic projection apparatus, such as mirrors, has an adverse effect on the performance of the apparatus, because such contamination affects the optical properties of the optical components.

It is known to reduce contamination of optical components of a lithographic projection apparatus by purging a space of the lithographic projection apparatus in which such a component is located with an ultra high purity gas, referred to as a purge gas. The purge gas prevents contamination of the surface, for example molecular contamination with hydrocarbons.

A drawback of this method is that the purge gas may have an adverse effect on the activity of chemicals used in the lithographic projection process. In particular, it has been found by the inventors that some types of radiation-sensitive material (resist), in particular resists sensitive to ultra-violet radiation and acetal-base photo-resists, do not function properly in an environment provided with the purge gas. Experiments performed by the inventors have revealed that these resists require a moisture, e.g. water vapour, to develop.

Furthermore, the purge gas may have an effect on the performance of measurement devices present in the lithographic projection apparatus, such as interferometric instruments. It has been found by the inventors that because of the lack of moisture, the purge gas affects the refractive index and thereby changes the outcome of interferometric measurements as well.

However, such moisture is not present in the purge gas used in the known methods. Thus, contamination cannot be reduced using the known purge gas supply system for these types of resists.

SUMMARY OF THE INVENTION

It is an aspect of the present invention to provide an improved lithographic projection apparatus, and in particular a lithographic projection apparatus in which contamination can be reduced with a purge gas without affecting the development of the resist.

According to one aspect of the present invention, a lithographic projection apparatus includes an illuminator configured to provide a beam of radiation; a support configured to support a patterning device. The patterning device is configured to pattern the beam of radiation according to a desired pattern. A substrate table is configured to hold a substrate. A projection system is configured to project the patterned beam onto a target portion of the substrate. At least one purge gas supply system is configured to provide a purge gas to at least part of the lithographic projection apparatus. The at least one purge gas supply system includes a purge gas mixture generator that includes a moisturizer configured to add moisture to a purge gas. The purge gas mixture generator is configured to generate a purge gas mixture. The purge gas mixture includes at least one purge gas and the moisture. A purge gas mixture outlet is connected to the purge gas mixture generator configured to supply the purge gas mixture to the at least part of the lithographic projection apparatus. Thus, moisture is present and the activity of chemicals, e.g. the development of the resists, is not affected by the purge gas.

According to another aspect of the present invention, a method for providing a purge gas to at least a part of a lithographic projection apparatus includes generating a purge gas mixture which includes at least one purge gas and moisture by adding moisture to a purge gas and supplying the purge gas mixture to at least a part of the lithographic projection apparatus. In the method a purge gas mixture including a purge gas and moisture is used. Thus, chemicals used in the lithographic projection apparatus are not affected by the purge gas.

According to a further aspect of the invention a device manufacturing method includes applying the method described above to at least a part of a substrate at least partially covered by a layer of radiation sensitive material; projecting a patterned beam of radiation onto a target portion of the layer of radiation-sensitive material; and supplying the purge gas mixture near a surface of a component used in the device manufacturing method.

According to a still further aspect of the present invention, a purge gas supply system includes a purge gas mixture generator comprising a moisturizer configured to add moisture to a purge gas, the purge gas mixture generator configured to generate a purge gas mixture including at least one purging gas and the moisture; and a purge gas outlet configured to supply the purge gas mixture to the at least part of the lithographic projection apparatus.

Further details, aspects and embodiments of the invention will be described, by way of example only, with reference to the attached drawings.

DETAILED DESCRIPTION

Figure 1:
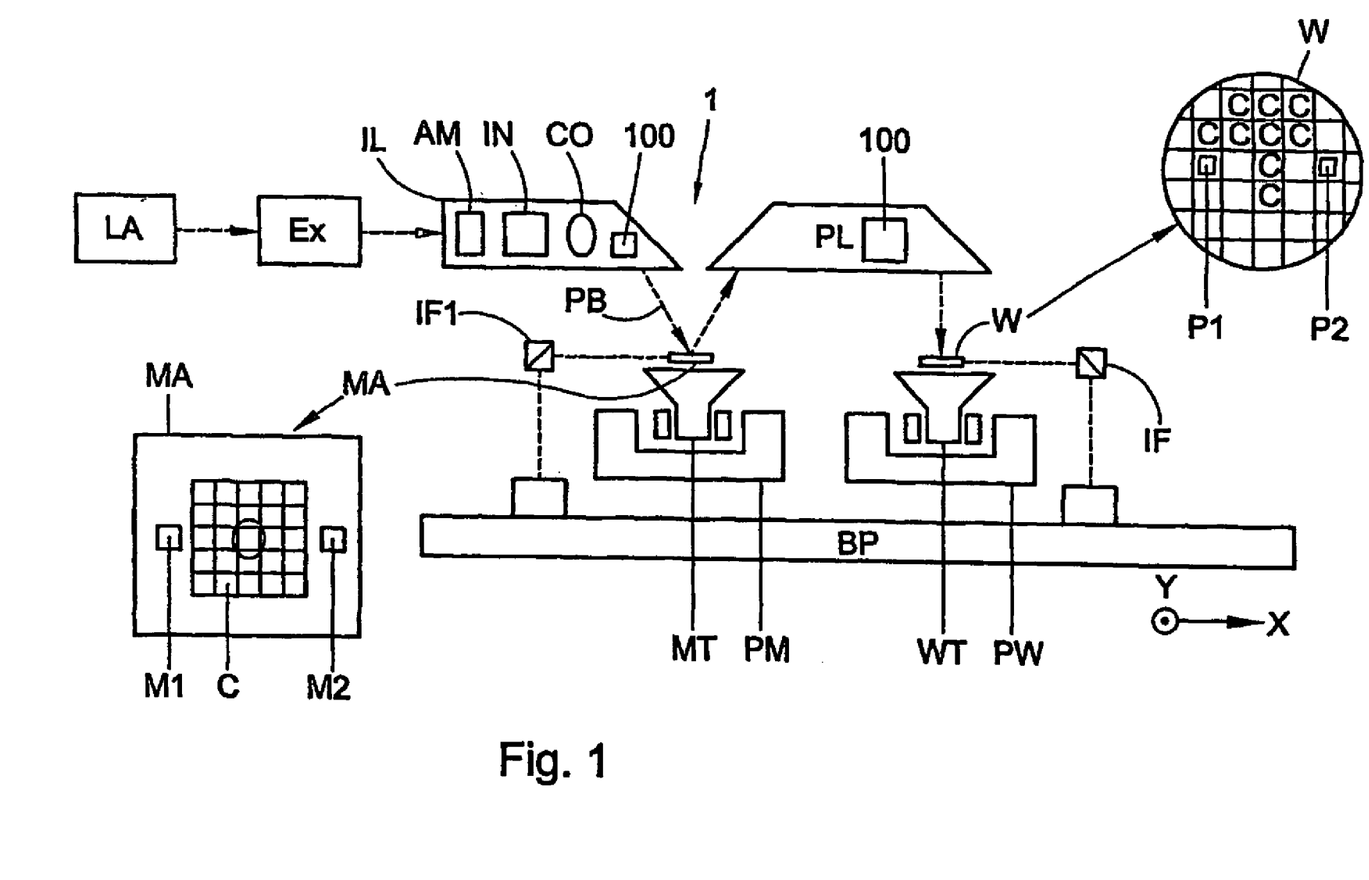
FIG. 1 schematically shows an example of an embodiment of a lithographic projection apparatus according to present invention.

FIG. 1 schematically depicts a lithographic projection apparatus 1 according to an embodiment of the present invention. The apparatus 1 includes a base plate BP. The apparatus may also include a radiation source LA (e.g. EUV radiation). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may include an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus. The radiation which it produces is led into the apparatus. This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the beam of radiation PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
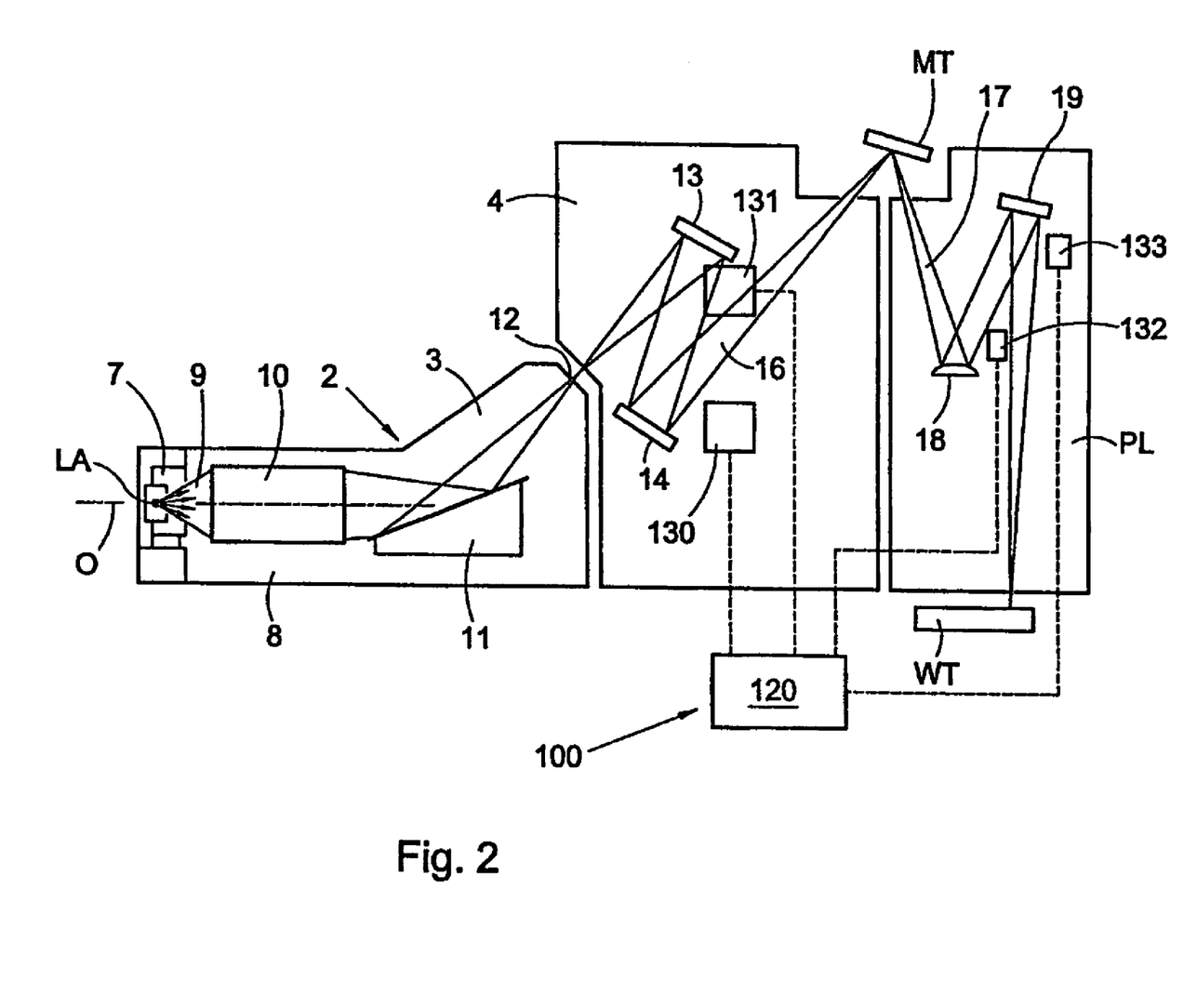
FIG. 2. shows a side view of an EUV illuminating system and projection optics of a lithographic projection apparatus according to the present invention.

FIG. 2 shows the projection system PL and a radiation system 2 which can be used in the lithographic projection apparatus 1 of FIG. 1. The radiation system 2 includes an illumination optics unit 4. The radiation system 2 may also comprise a source-collector module or radiation unit 3. The radiation unit 3 is provided with a radiation source LA which may be formed by a discharge plasma. The radiation source LA may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis 0. Partial pressures of 0.1 mbar of Xe, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure 9 includes a channel structure such as, for instance, described in detail in U.S. Pat. Nos. 6.862.075 and 6,359,969.

The collector chamber 8 comprises a radiation collector 10 which can be a grazing incidence collector. Radiation passed by collector 10 is reflected off a grating spectral filter 11 to be focused in a virtual source point 12 at an aperture in the collector chamber 8. From chamber 8, the projection beam 16 is reflected in illumination optics unit 4 via normal incidence reflectors 13, 14 onto a reticle or mask positioned on reticle or mask table MT. A patterned beam 17 is formed which is imaged in projection system PL via reflective elements 18, 19 onto a wafer stage or substrate table WT. More elements than shown may generally be present in illumination optics unit 4 and projection system PL.

As is shown in FIG. 2 the lithographic projection apparatus 1 includes a purge gas supply system 100. Purge gas outlets 130–133 of the purge gas supply system 100 are positioned in the projection system PL and the radiation system 2 near the reflectors 13,14 and the reflective elements 18,19, as is shown in FIG. 2. However, if so desired other parts of the apparatus may likewise be provided with a purge gas supply system. For example, a reticle and one or more sensors of the lithographic projection apparatus may be provided with a purge gas supply system.

In FIGS. 1 and 2, the purge gas supply system 100 is positioned inside the lithographic projection apparatus 1 and the purge gas supply system 100 can be controlled in any manner suitable for the specific implementation using any device outside the apparatus 1. However, it is likewise possible to position at least some parts of the purge gas supply system 100 outside the lithographic projection apparatus 1, for example the purge gas mixture generator 120.

Figure 3:
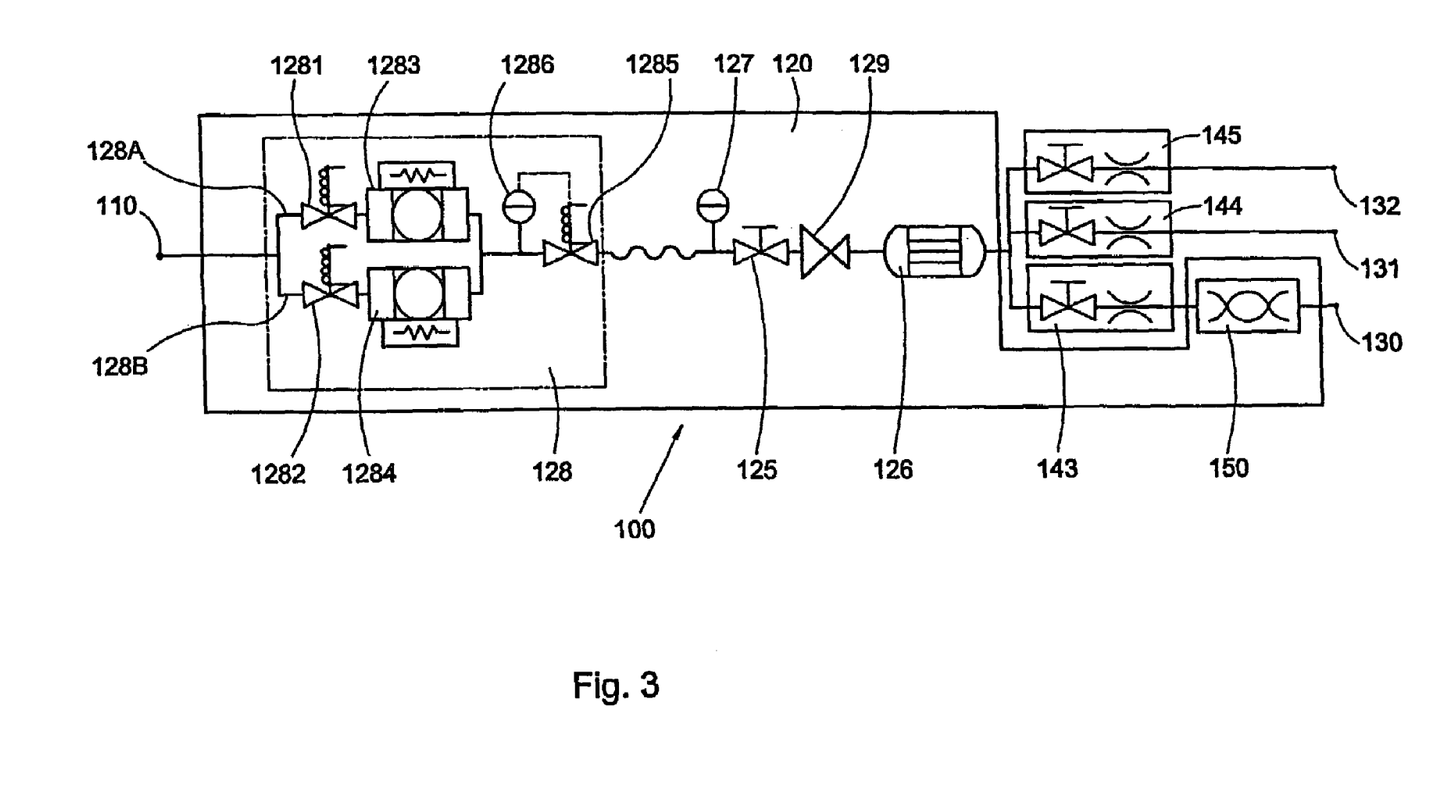
FIG. 3 schematically shows a circuit diagram of an example of a purge gas supply system according to the present invention.

FIG. 3 shows an exemplary embodiment of a purge gas supply system 100. A purge gas inlet 110 is connected to a purge gas supply apparatus (not shown) which supplies a dry gas which is substantially without moisture, for example, a pressurised gas supply circuit, a cylinder with compressed dry air or otherwise. The dry gas is fed through the purge gas mixture generator 120. In the purge gas mixture generator 120 the dry gas is purified further, as explained below. Further, the purge gas mixture generator 120 includes a moisturizer 150 which adds moisture to the dry gas, for some of the purge gas outlets 130–132. The moisturizer 150 is connected a single purge gas outlet 130. The other purge gas outlets 131,132 are not connected to the moisturizer 150. Thus, at the purge gas outlet 130, a purge gas mixture including the purge gas and moisture is presented, whereas at the other purge gas outlets 131,132 only the dry purge gas is presented. Thereby the purge gas mixture may be provided only near surfaces provided with chemicals which require a moisture, such as the wafer table WT, whereas other parts of the lithographic projection apparatus 1 can be provided with a dry purge gas, i.e, without moisture.

Furthermore, because the moisture is added to a purge gas, properties of the purge gas mixture, such as the relative humidity or purity of the moisture, can be controlled with a good accuracy. Also, because of the moisturizer the system is flexible, because the amount of moisture present in the purge gas mixture may easily be adjusted by adding more or less moisture to the purge gas.

The purge gas mixture generator 120 includes, in a flow direction: a purifier apparatus 128, a flow meter 127, a valve 125, a reducer 129, a heat exchanger 126 and the moisturizer 150.

A compressed dry air (CDA) from a CDA source (not shown) is supplied to the purifier apparatus 128 via the purge gas inlet 110. The CDA is purified by the purifier 128. The purifier 128 includes two parallel flow branches 128A,128B each including, in the flow direction: an automatic valve 1281,1282 and a regenerable purifier device 1283,1284. The regenerable purifier devices 1283,1284 are each provided with a heating element to heat and thereby regenerate the respective purifier device 1283,1284. The flow branches are connected downstream of the purifier devices 1283,1284 to a shut-off valve 1285 which is controlled by a purity sensor 1286.

Because of the regenerable purifiers, the system can be used for a long time by regenerating the purifiers in case they become saturated with the compounds removed from the purge gas. The regenerable purifiers may be of any suitable type, for example a regenerable filter which removes contaminating compounds or particles out of a gas by a physical process, such as adsorption, catalysis or otherwise, as opposed to non regenerable chemical processes occuring in a charcoal filter, for example. In general, a regenerable purifier does not contain organic material and the regenerable purifiers may, for example, contain a material suitable for physical binding a contaminant of the purge gas, such as metals, including zeolite, titanium oxides, gallium or palladium compounds, or others.

The purifier devices 1283,1284 are alternately put in a purifying state, in which the CDA is purified, and a regenerating state. In the regenerating state the purifier device is regenerated by the respective heating element. Thus, for example, while the purifier device 1283 purifies the CDA, the purifier device 1284 is regenerated. The purifier apparatus 128 can thus operate continuously while maintaining a constant level of purification.

The automatic valves 1281,1282 are operated in correspondence with the operation of the corresponding purifier device 1283,1284. Thus, when a purifier device 1283 or 1284 is regenerated, the corresponding valve 1281 or 1282 is closed. When a purifier device 1283 or 1284 is used to purify, the corresponding valve 1281 or 1282 is open.

The purified CDA is fed through the shut-off valve 1285 which is controlled by the purity sensor 1286. The purity sensor 1286 automatically closes the shut-off valve 1285 when the purity of the purified CDA is below a predetermined threshold value. Thus, contamination of the lithographic projection apparatus 1 with a purge gas with insufficient purity levels is prevented automatically.

The flow of purified CDA can be monitored via the flow meter 127. Via the valve 125 the flow can be shut-off manually. The reducer 129 provides a stable pressure at the outlet of the reducer, thus a stable purge gas pressure is provided to restrictions 143–145 (via the heat exchanger 126).

The heat exchanger 126 provides a constant purified CDA temperature. The heat exchanger 126 extracts or adds heat to the purified CDA in order to achieve a gas temperature which is suitable for the specific implementation. In a lithographic projection apparatus, for example, stable processing conditions are required and the heat exchanger may thus stabilize the temperature of the purified CDA to have a gas temperature which is constant over time. Suitable conditions for the purge gas at the purge gas outlets, for example, are found to be: a flow of 20–30 standard liters per minute, and/or a temperature of the purge gas of about 22 degrees Celsius and/or a relative humidity in the range of 30–60%. However, the invention is not limited to these conditions and other values for these parameters may likewise be used in a system according to the present invention.

The heat exchanger 126 is connected via restrictions 143–145 to the purge gas outlets 130–132. The restrictions 143–145 limit the gas flow, such that at each of the purge gas outlets 130–132 a desired, fixed purge gas flow and pressure is obtained. A suitable value for the purge gas pressure at the purge gas outlets is, for example, 100 mbar. It is likewise possible to use adjustable restrictions to provide an adjustable gas flow at each of the purge gas outlets 130–132.

The moisturizer 150 is connected downstream from the heat exchanger between the restriction 143 and the purge gas outlet 130. The purge gas outlet 130 is provided in the example of FIGS. 1 and 2 near the wafer table WT. The moisturizer 150 adds moisture to the purified CDA and thus provides a purge gas mixture to the outlet 130. In this example, only at a single outlet a purge gas mixture is discharged. However, it is likewise possible to discharge a purge gas mixture to two or more purge gas outlets, for example by connecting a multiple of purge gas outlets to separate moisturizers or connecting two or more outlets to the same moisturizer. It is likewise possible to provide a moisturizer at a different position in the purge gas mixture generator than is shown in FIG. 3. For example, the moisturizer 150 may be placed between the purge gas mixture generator 120 and the valve 143 instead of between the valve 143 and the purge gas outlet 130. The moisturizer 150 operates as a restriction as well and if so desired, the restriction 130 connected to the moisturizer 150 may be omitted.

Figure 4:
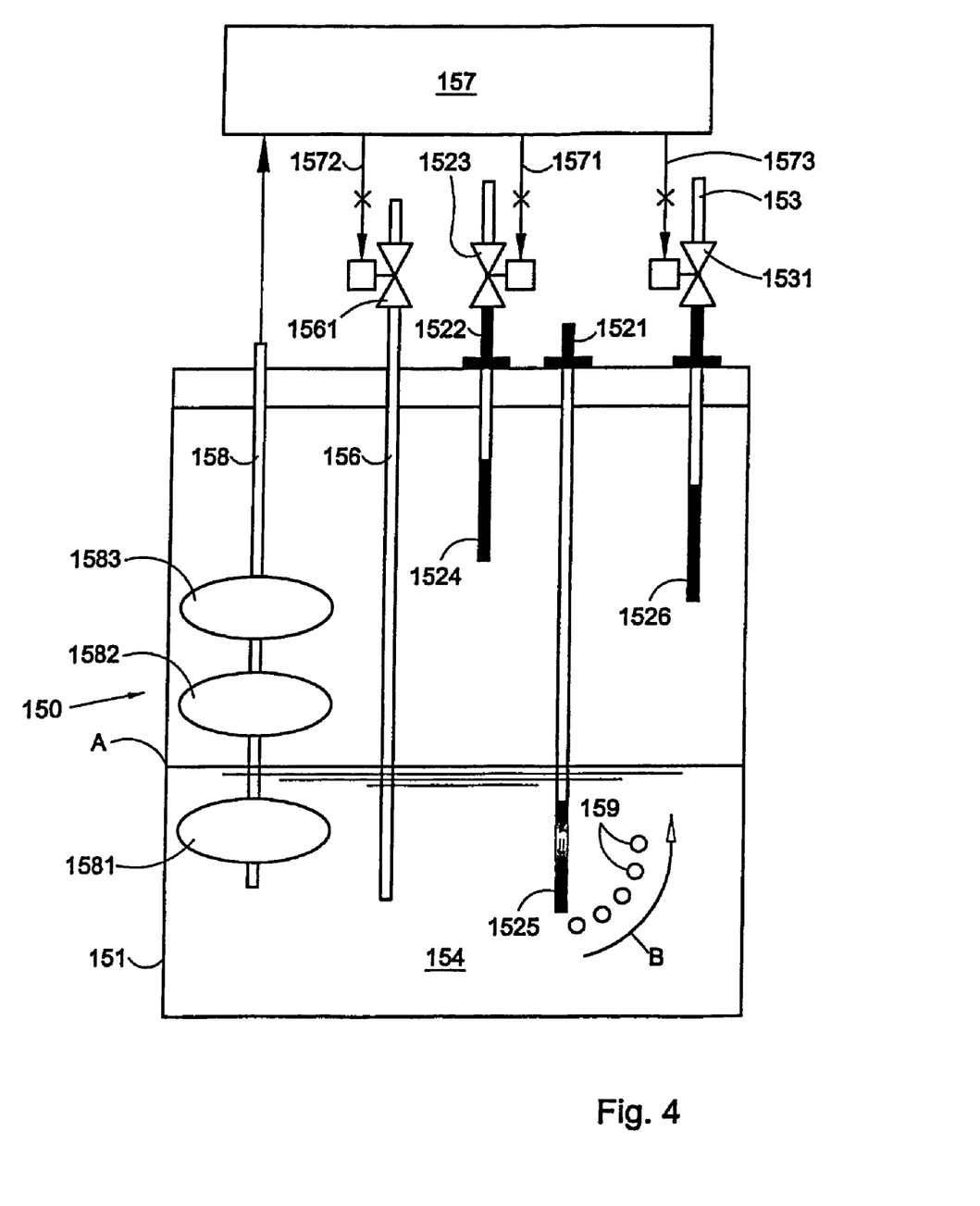
FIG. 4 schematically shows a moisturizer device suitable for in the example of FIG. 3.

The moisturizer 150 may, for example, be implemented as shown in FIG. 4. However, the moisturizer 150 may likewise be implemented differently, and, for example, include a vaporizer which vaporizes a fluid into a flow of purge gas.

The moisturizer 150 shown in FIG. 4 includes a liquid vessel 151 which is filled to a liquid level A with a liquid 154, such as high purity water for example. A gas inlet 1521 (hereinafter "wet gas inlet 1521"), is placed mounding submerged in the liquid 154, that is below the liquid level A. Another gas inlet 1522 (hereinafter "dry gas inlet 1522"), is placed mounding above the liquid level A, that is in the part of the liquid vessel 151 not filled with the liquid 154. A gas outlet 153 connects the part of the liquid vessel 153 above the liquid 154 with other parts of the purge gas supply system 100. A purge gas, e.g. purified compressed dry air, is fed into the liquid vessel 151 via the wet gas inlet 1521. Thus, bubbles 159 of purge gas are generated in the liquid 154. Due to buoyancy, the bubbles 159 travel upwards after mounding in the liquid 154, as indicated in FIG. 4 by arrow B. During this upwards travelling period, moisture from the liquid 154 enters the bubbles 159, for example due to diffusive processes. Thus, the purge gas in the bubbles 159 is mixed with moisture. At the surface of the liquid i.e. at the liquid level A, the bubbles 159 supply their gaseous content to the gas(es) present in the liquid vessel 151 above the liquid 154. The resulting purge gas mixture is discharged from the vessel via the gas outlet 153.

The wet gas inlet 1521 is a tubular element with an outside end connected outside the liquid vessel 151 to a purge gas supply device (not shown), such as the purge gas mixture generator 120 of FIG. 3. The wet gas inlet 1521 is provided with a filter element 1525 with small, e.g. 0.5 micron, passages at an inside end which is positioned in the inside of the liquid vessel 151. The filter element 1525 is at least partially, in this embodiment entirely, placed in the liquid 154. Thus, the wet gas inlet 1521 generates a large amount of very small bubbles of purge gas. Because of their small size (e.g., about 0.5 micron), however, the bubbles 159 are moisturized to saturation in a relatively short time period, i.e. a relatively short travelling distance through the liquid 154.

The dry gas inlet 1522 is provided with a filter element 1524 similar to the filter element of the wet gas inlet 1521. Thereby, the gas flow through the wet gas inlet 1521 and the dry gas inlet 1522 is substantially similar, and the amount of moisture in the purge gas mixture is substantially half the amount of moisture in the bubbles 159 at the moment the bubbles 159 leave the liquid 154. That is, if the bubbles 159 are saturated with moisture, i.e. 100% relative humidity (Rh), the purge gas mixture has a 50% Rh. However, it is likewise possible to provide in a different ratio of gas flowing into the liquid vessel via the wet gas inlet 1521 and the dry gas inlet 1522 respectively and thereby adjust the relative humidity between 0–100% Rh.

It is found by the inventors that specifically a purge gas mixture with a relative humidity above or equal to 20%, such as equal or more than 25%, provides good results with respect to the performance of photo-resists. Furthermore, it is found that a purge gas mixture with a relative humidity equal or above 25% and below 70%, such as 60%, has a good preventive effect with respect to the accuracy of measurement systems in the lithographic projection apparatus. Furthermore, it was found that a humidity, e.g. about 40%, which is similar to the humidity in the space surrounding the lithographic projection apparatus, e.g. the clean room, provides optimal results.

The gas outlet 153 is provided at its inside end with a fine-meshed, e.g. 0.003 micron, filter 1526 which filters particles and small droplets out of the gas flowing out of the liquid vessel 151. Thus, contamination of the surface to which the purge gas mixture is supplied by such particles is prevented.

The relative amount of moisture in the purge gas mixture can be controlled in different ways. For example, parameters of the liquid vessel 151 can be controlled. Also, for example, the amount of purge gas without moisture brought into the vessel 151 via the dry gas inlet 1522 relative to the amount of purge gas with moisture generated via the wet gas inlet 1521 can be controlled. The controlled parameters of the liquid vessel 151 may for example be one or more of: the inside temperature, flow, pressure, residence time of the purge gas in the liquid.

Temperature is known to have an effect on the saturation amount of moisture that can be present in a gas, for example. To control the temperature, the liquid vessel 151 may be provided with a heating element which is controlled by a control device, or controller, in response to a temperature signal representing a temperature inside the liquid vessel provided by a temperature measuring device, for example.

The residence time of the bubbles in the liquid 154 can be changed by adjusting the position at which the gas bubbles are inserted in the liquid via the wet gas inlet 1521. For example, when the filter 1525 is positioned further into the liquid 154, the distance the bubbles have to travel to the liquid level A is increased and hence the residence time increases as well. The longer the gas bubbles are present in the liquid 154, the more moisture can be absorbed into the gas. Thus, by changing the residence time the humidity of the gas can be adapted.

The moisturizer device 150 is further provided with a control device 157 via which the amount of moisture in the purge gas mixture can be controlled. The control device 157 is connected with a moisture control contact 1571 to a control valve 1523 in the dry gas inlet 1522 via which the flow rate of the purge gas supplied to the dry inlet 1522 can be controlled and therefore the amount of dry purge gas relative to the amount of moisturized gas.

The control device 157 further controls the amount of liquid 154 present in the liquid vessel 151. The control device 157 is connected with a liquid control contact 1572 to a control valve 1561 of a liquid supply 156 and with an overflow contact 1573 to a control valve 1531 of the gas outlet 153. A liquid level measuring device 158 is communicatively connected to the control device 157. The liquid level measuring device 158 provides a liquid level signal to the control device 157 which represents a property of the liquid level in the liquid vessel 151. The control device 157 operates the control valve 1561 and the control valve 1531 in response to the liquid level signal.

In this example, the liquid level measuring device 158 includes three float switches 1581–1583 positioned at suitable, different, heights with respect to the bottom of the liquid vessel 151. A lowest float switch 1581 is positioned nearest to the bottom. The lowest float switch 1581 provides an empty signal to the control device 157 when the liquid level A is at or below the lowest float switch 1581. In response to the empty signal, the control devices 157 opens the control valve 1561 and automatically liquid is supplied to the vessel.

The float switch 1582 in the middle provides a full signal in case the liquid level A reaches the height of this flow switch 1582. The control device 157 closes the control valve 1561 in response to the full signal and thereby turns off the liquid supply.

A top float switch 1583 is positioned furthest away from the bottom. The top float switch 1583 provides an overfill signal to the control device 157 in case the liquid level A is at or above the top float switch 1581. In response to the overfill, the control device 157 shuts off the control valve 1531 of the gas outlet 153 to prevent leakage of the liquid into other parts of the lithographic projection apparatus 1.

It should be noted that the above-mentioned embodiments illustrate rather than limit the invention, and that those skilled in the art will be able to design alternatives without departing from the scope of the invention.

What is claimed is:

1. A lithographic projection apparatus, comprising:
   an illuminator configured to condition a beam of radiation;
   a support configured to support a patterning device, the patterning device configured to pattern the beam according to a desired pattern;
   a substrate table configured to hold a substrate;
   a projection system configured to project the patterned beam onto a target portion of the substrate; and
   at least one purge gas supply system configured to provide a purge gas to at least part of the lithographic projection apparatus, the at least one purge gas supply system comprising:
      a purge gas mixture generator comprising a moisturizer configured to add moisture to a purge gas, the purge gas mixture generator configured to generate a purge gas mixture, which gas mixture comprises at least one purge gas and the moisture, wherein the moisturizer comprises a vessel with at least one gas inlet and gas outlet, the at least one gas inlet and gas outlet being connected to each other via a moisturizing connection, such that in case a purge gas flows through the moisturizing connection, the purge gas is fed through a liquid present in the vessel and the purge gas is moisturized;
      a purge gas mixture outlet connected to the purge gas mixture generator configured to supply the purge gas mixture to the at least part of the lithographic projection apparatus; and
      a dry gas inlet configured to mix a non-moisturized purge gas with the moisturized purge gas fed through the liquid to thereby obtain the purge gas mixture.

2. A lithographic projection apparatus according to claim 1, wherein the moisturizing connection is a saturating connection configured to feed the purge gas through the liquid such that the purge gas is moisturized to saturation with the moisture.

3. A lithographic projection apparatus according to claim 1, further comprising a control device connected to the vessel configured to control at least an amount of moisture present in the purge gas mixture.

4. A lithographic projection apparatus according to claim 1, wherein the purge gas mixture generator further comprises at least one regenerable filter device configured to filter at least one undesired component out of at least one of: the purge gas, the moisture or the purge gas mixture.

5. A lithographic projection apparatus according to claim 4, wherein the at least one regenerable filter device comprises two regenerable filter devices connected in parallel, the filter devices can be regenerated in an alternating manner to allow continuous filtering.

6. A lithographic projection apparatus according to claim 1, wherein the purge gas supply system further comprises a purge gas outlet configured to provide the purge gas substantially without moisture to another part of the lithographic projection apparatus.

7. A lithographic projection apparatus according to claim 1, wherein the moisture includes water vapor.

8. A lithographic projection apparatus according to claim 7, wherein the purge gas mixture contains between at least 20% and not more than 70% relative humidity water vapor.

9. A lithographic projection apparatus according to claim 8, configured to a purge gas mixture flow rate of at least 20 liters per minute.

10. A lithographic projection apparatus according to claim 1, further comprising:
    a heater or heat exchanger; and
    a control device connected to the heater or heat exchanger to control a temperature of the liquid.

11. A lithographic projection apparatus according to claim 1, wherein the dry gas inlet is connected to the at least one gas outlet.

12. A purge gas supply system for providing a purge gas to at least part of a lithographic projection apparatus, the purge gas supply system comprising:
    a purge gas mixture generator comprising a moisturizer configured to add moisture to a purge gas, the purge gas mixture generator configured to generate a purge gas mixture including at least one purging gas and the moisture, wherein the moisturizer comprises a vessel with at least one gas inlet and gas outlet, the at least one gas inlet and gas outlet being connected to each other via a moisturizing connection, such that in case a purge gas flows through the moisturizing connection, the purge gas is fed through a liquid present in the vessel and the purge gas is moisturized;
    a purge gas outlet configured to supply the purge gas mixture to the at least part of the lithographic projection apparatus;
    a dry gas inlet configured to mix a non-moisturized purge gas with the moisturized purge gas fed through the liquid to thereby obtain the purge gas mixture.

13. A purge supply system according to claim 12, wherein the moisturizing connection is a saturating connection configured to feed the purge gas through the liquid such that the purge gas is moisturized to saturation with the moisture.

14. A purge gas supply system according to claim 12, further comprising a control device connected to the vessel configured to control at least an amount of moisture present in the purge gas mixture.

15. A purge gas supply system according to claim 12, wherein the purge gas mixture generator further comprises at least one regenerable filter device configured to filter at least one undesired component out of at least one of: the purge gas, the moisture or the purge gas mixture.

16. A purge gas supply system according to claim 15, wherein the at least one regenerable filter device comprises two regenerable filter devices connected in parallel, the filter devices can be regenerated in an alternating manner to allow continuous filtering.

17. A purge gas supply system according to claim 12, wherein the moisture includes water vapor.

18. A purge gas supply system according to claim 12, wherein the purge gas mixture contains between at least 20% and not more than 70% relative humidity water vapor.

19. A purge gas supply system according to claim 18, configured to a purge gas mixture flow rate of at least 20 liters per minute.

20. A purge gas supply system according to claim 12, further comprising:
   a heater or heat exchanger; and
   a control device connected to the heater or heat exchanger to control a temperature of the liquid.

* * * * *